(12) United States Patent
Osaki et al.

(10) Patent No.: US 10,186,399 B2
(45) Date of Patent: Jan. 22, 2019

(54) SCANNING ELECTRON MICROSCOPE

(71) Applicant: HITACHI HIGH-TECHNOLOGIES CORPORATION, Tokyo (JP)

(72) Inventors: Mayuka Osaki, Tokyo (JP); Chie Shishido, Tokyo (JP); Maki Tanaka, Tokyo (JP); Hitoshi Namai, Tokyo (JP); Fumihiro Sasajima, Tokyo (JP); Makoto Suzuki, Tokyo (JP); Yoshinori Momonoi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 52 days.

(21) Appl. No.: 15/445,055

(22) Filed: Feb. 28, 2017

(65) Prior Publication Data

US 2017/0301513 A1   Oct. 19, 2017

(30) Foreign Application Priority Data

Apr. 15, 2016 (JP) .................................. 2016-082376

(51) Int. Cl.
   *H01J 37/28*   (2006.01)
   *H01J 37/285*  (2006.01)
   *H01J 37/244*  (2006.01)

(52) U.S. Cl.
   CPC .......... *H01J 37/285* (2013.01); *H01J 37/244* (2013.01); *H01J 37/28* (2013.01); *H01J 2237/221* (2013.01); *H01J 2237/24578* (2013.01); *H01J 2237/2814* (2013.01)

(58) Field of Classification Search
   CPC ........ H01J 37/285; H01J 37/244; H01J 37/28; H01J 2237/221; H01J 2237/24578; H01J 2237/2814
   USPC .......................... 250/306, 307, 309, 310, 311
   See application file for complete search history.

(56) References Cited

U.S. PATENT DOCUMENTS

| | | | | |
|---|---|---|---|---|
| 7,807,980 B2 * | 10/2010 | Shishido | ............... | H01J 37/263 |
| | | | | 250/492.1 |
| 8,890,068 B2 * | 11/2014 | Kasai | .................... | H01J 37/244 |
| | | | | 250/310 |
| 2002/0006497 A1 * | 1/2002 | Noda | ...................... | H01L 22/34 |
| | | | | 428/156 |

(Continued)

FOREIGN PATENT DOCUMENTS

WO   2015/159792 A1   10/2015

*Primary Examiner* — Nicole Ippolito
(74) *Attorney, Agent, or Firm* — Volpe and Koenig, P.C.

(57) ABSTRACT

A scanning electron microscope capable of properly determining a step of a step pattern formed on a sample regardless of combination of material of a groove of the step pattern and material of a projection of the step pattern, the scanning electron microscope includes a beam source, a detection unit having a first detection unit that detects a secondary electron emitted from the sample at an angle between an optical axis direction of the primary electron beam which is equal to or less than a predetermined value, and a second detection unit that detects a secondary electron emitted from the sample at an angle between the optical axis direction of the primary electron beam which is greater than the predetermined value, and a processing unit to obtain information on the step pattern using the information on a ratio between signals outputted from the first and the second detection unit.

10 Claims, 18 Drawing Sheets

(56) References Cited

U.S. PATENT DOCUMENTS

| | | | | |
|---|---|---|---|---|
| 2012/0274757 A1* | 11/2012 | Bai | ................... | H01J 37/244 |
| | | | | 348/79 |
| 2013/0245989 A1* | 9/2013 | Kadowaki | ............. | H01J 37/261 |
| | | | | 702/150 |
| 2014/0001360 A1* | 1/2014 | Kasai | ................... | H01J 37/244 |
| | | | | 250/307 |

* cited by examiner lot number

F I G. 20
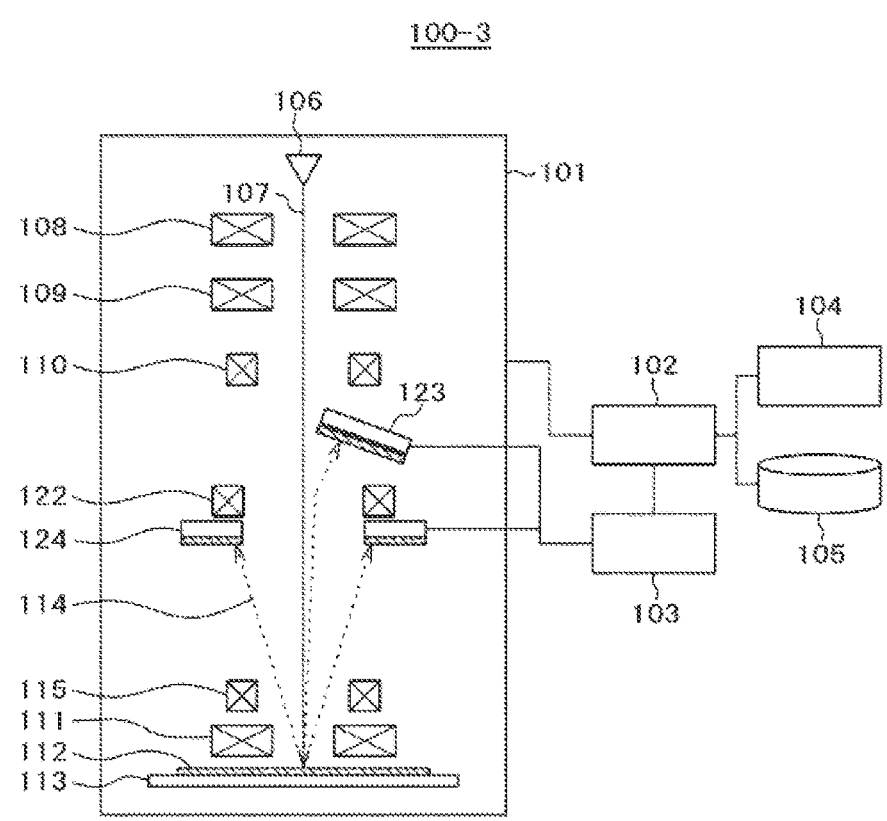

F I G. 2 1
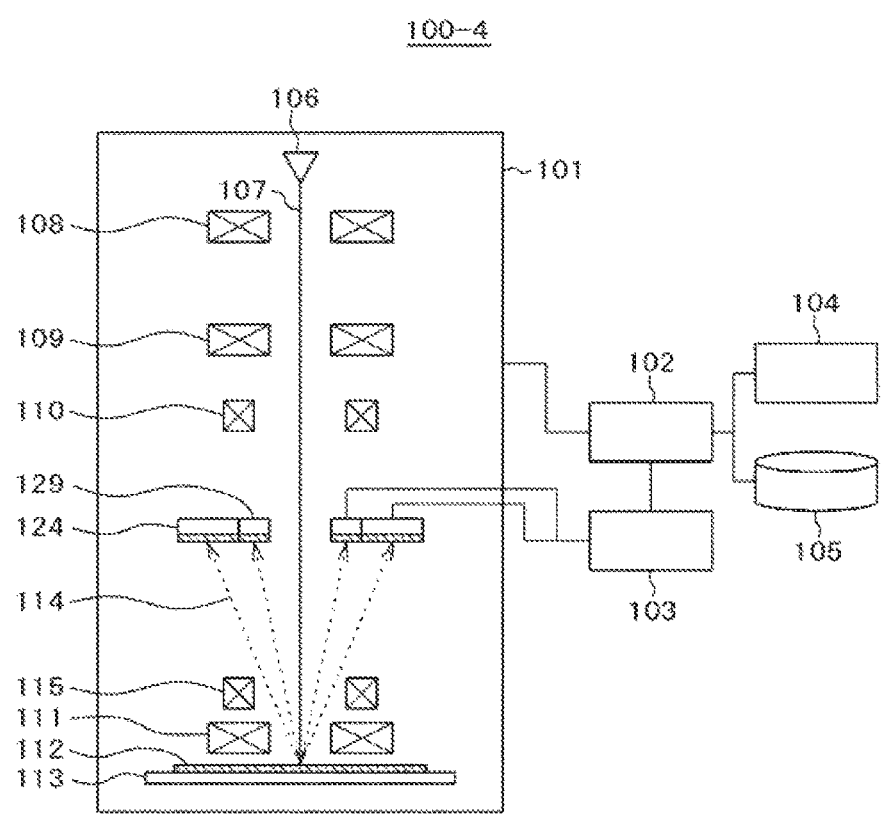

SCANNING ELECTRON MICROSCOPE

BACKGROUND OF THE INVENTION

As a background technique of the technical field of the invention, International Publication WO/2015/159792 (Patent Literature 1) is known. The publication has a description "proposed is a charged particle beam device comprising: at least two detectors to detect charged particles, obtained based on irradiation of a charged particle beam emitted from a charged particle source; and an image processing device to process an image, formed based on output from the detectors, wherein the image processing device performs masking on an edge region of images obtained based on the charged particles obtained with the two or more detectors, and performs difference operation on the two or more images. Further proposed is a charged particle beam device that performs matching or the like using the images subjected to the marking."

Patent Literature 1 discloses a charged particle beam device in which an edge region of an image of an imaging object pattern is determined by difference operation with respect to two or more images obtained with at least two detectors for detection of charged particles, and pattern alignment is performed. However, in the processing in Patent Literature 1, it is not possible to properly determine a step of a step pattern (a pattern with a step formed with a projection and a groove such as a line, a hole and the like (hereinbelow, referred to as a "step pattern")) as an imaging object in accordance with combination of materials of the groove and the projection of the pattern, and in such case, the pattern alignment fails.

SUMMARY OF THE INVENTION

The present invention has been made to solve the problem of the above-described conventional technique, and provide a scanning electron microscope to properly determine a step of an imaging object step pattern regardless of combination of materials of a groove and a projection of the imaging object step pattern.

To solve the above problem, in the scanning electron microscope according to the present invention, determination is performed on a step as an imaging object by calculation of the ratio between two or more images obtained with at least two detectors to detect charged particles.

That is, to solve the above-described problem, the present invention provides a scanning electron microscope including: a beam source that irradiates a primary electron beam; a detection unit that detects secondary electrons generated from a measurement object by irradiation of the primary electron beam to the measurement object; and a processing unit that processes a signal detected with the detection unit, wherein the detection unit has: a first detection unit that detects a secondary electron at an angle between an optical axis direction of the primary electron beam irradiated to the measurement object and an emission direction of the secondary electron from the measurement object equal to or less than a predetermined value; and a second detection unit that detects a secondary electron at an angle between the optical axis direction of the primary electron beam irradiated to the measurement object and the emission direction of the secondary electron from the measurement object greater than the predetermined value, and wherein the processing unit obtains a ratio between signals outputted from the first detection unit and the second detection unit, and obtains information on a step pattern formed on the measurement object by using information on the obtained ratio.

Further, to solve the above-described problem, the present invention provides a scanning electron microscope including: a beam source that irradiates a primary electron beam; a detection unit that detects secondary electrons generated from a measurement object by irradiation of the primary electron beam to the measurement object; and a processing unit that processes a signal detected with the detection unit, wherein the detection unit has: a first detection unit that detects secondary electrons generated from the measurement object; and a second detection unit provided on the measurement object side with respect to the beam source comparing to the first detection unit; and wherein the processing unit obtains a ratio between signals outputted from the first detection unit and the second detection unit, and obtains information on a step pattern formed in the measurement object by using information on the obtained ratio.

According to the present invention, it is possible to determine a step of an imaging object step pattern regardless of combination of materials of a groove and a projection of the step of the imaging object step pattern.

Other objects, structures and advantages of the present invention will be apparent from the following description of the embodiments taken in conjunction with the accompanying drawings.

BRIEF DESCRIPTION OF THE DRAWINGS

FIG. 17 is a graph showing another example of index values to obtain the opening angle in the third embodiment of the present invention, showing a minimum value in the ratio R waveform, the distance between the minimum value and a wall, the area of a concavity of the ratio R waveform and the like;

FIG. 20 is a block diagram showing a schematic configuration of a scanning electron microscope 100-3 according to the fourth embodiment of the present invention;

FIG. 21 is a block diagram showing a schematic configuration of a scanning electron microscope 100-4 according to the fourth embodiment of the present invention;

DESCRIPTION OF THE PREFERRED EMBODIMENTS

Figure 1:
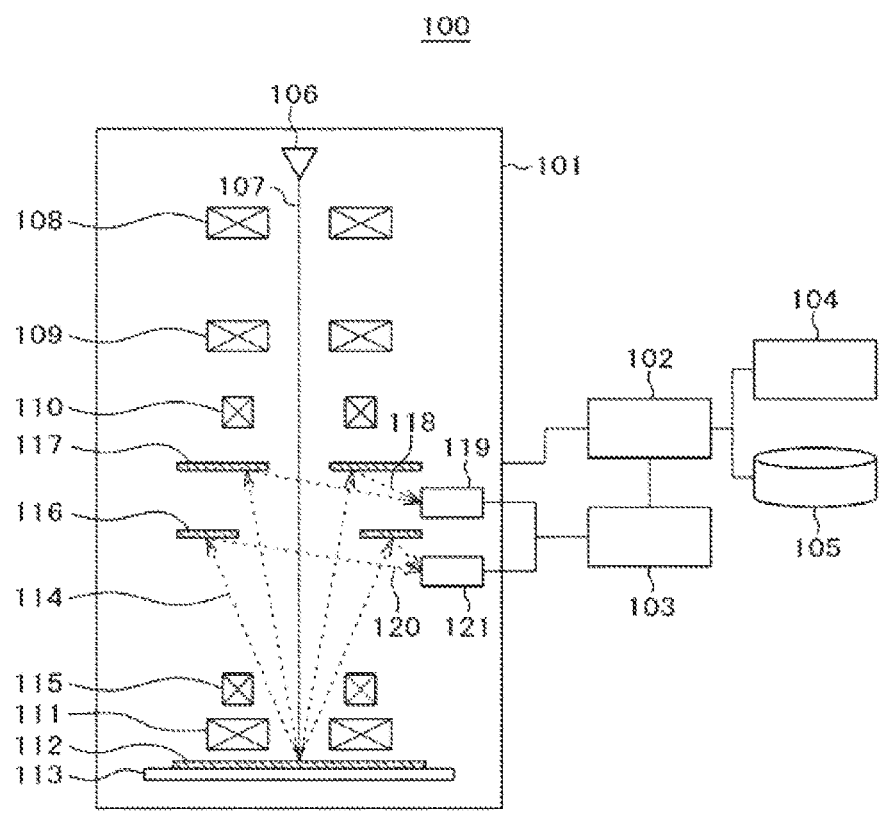
FIG. 1 is a block diagram showing a schematic configuration of a scanning electron microscope according to a first embodiment of the present invention.

The present invention provides a scanning electron microscope having a beam source for irradiation of a primary electron beam, a detection unit that detects secondary electrons generated from a measurement object by irradiation of the primary electron beam to the measurement object, and a processing unit that processes a signal detected with the detection unit. The detection unit has a first detection unit that detects a secondary electron at an angle formed with an optical direction of the primary electron beam irradiated to the measurement object and an emission direction of the secondary electron from the measurement object equal to or less than a predetermined value, and a second detection unit that detects a secondary electron at an angle formed with the optical direction of the primary electron beam irradiated to the measurement object and the emission direction of the secondary electron from the measurement object greater than the predetermined value. The processing unit obtains the ratio between signals outputted from the first detection unit and the second detection unit, and obtains information on a step pattern formed in the measurement object by using information regarding the obtained ratio. It makes possible to determine the imaging object step pattern regardless of combination of materials of a groove and a projection of the imaging object step pattern.

Hereinbelow, embodiments of the present invention will be described in detail based on the drawings. In all the figures for explanation of the embodiments, elements having the same functions have the same reference numerals, and basically, repeated explanations of these elements will be omitted.

Note that the present invention is not limited to the description of the following embodiments. It is apparent to those skilled in the art to make various changes of the specific configuration without departing from the spirit and scope of the invention.

First Embodiment

In the present embodiment, an example of a scanning electron microscope to determine a step of a pattern as an imaging object will be described.

FIG. 1 shows an example of the configuration of a scanning electron microscope 100 according to the present embodiment.

The scanning electron microscope 100 has an imaging unit 101, a general control unit 102, a signal processing unit 103, an input/output unit 104, and a memory 105.

The imaging unit 101 has an electron gun 106, an acceleration electrode 108 to accelerate an electron beam 107 irradiated from the electron gun 106, a condenser lens 109 to collect the electron beam 107, a polarizing lens 110 to deflect the track of the electron beam 107, an objective lens 111 to control the height of convergence position of the electron beam 107, a stage 113 on which a sample 112 as an imaging object is placed, a secondary electron aligner 115 to control the track of the secondary electrons 114 generated from the sample 112 irradiated with the electron beam 107, a detection aperture 116 to discriminate a detection angle of the secondary electrons 114, a reflector 117 to detect the secondary electrons 114 having passed through the detection aperture 116, a detector 1:119 to detect tertiary electrons 118, generated by collision of the secondary electrons 114 against the reflector 117, and a detector 2:121 to detect tertiary electrons 120 generated by collision of the secondary electron 114 against the detection aperture 116. The imaging unit 101 is controlled by the general control unit 102.

The signals detected by the detector 1:119 and the detector 2:121 are converted into image data by the processing unit 103 in accordance with an instruction from the general control unit 102.

In the present embodiment, the angle at which a secondary electron is emitted from the surface of the sample is detected by a certain range (discriminative boundary zenith angle $q_D$) of a zenith angle (assuming that the sample surface is a plane, the zenith angle is an angle from a direction vertical to the sample surface to the angle to an optical axis direction of the electron beam 107 irradiated to the sample 112). One of the purposes of the zenith angle discriminative detection of the secondary electrons is selective detection of a signal from a groove of a step pattern. For this purpose, it is desirable that the discriminative boundary zenith angle $q_D$ is approximately the same as the opening angle of the groove of the supposed evaluation object step pattern. In the present embodiment, the discriminative boundary zenith is 30°.

By adjustment with the secondary electron aligner 115 and selection of hole diameter of the detection aperture 116, the detector 1:119 detects a secondary electron at an angle equal to or smaller than the discriminative boundary zenith angle $q_D$, and the detector 2:121 detects a secondary electron at an angle larger than the discriminative boundary zenith angle $q_D$.

Figure 2A:
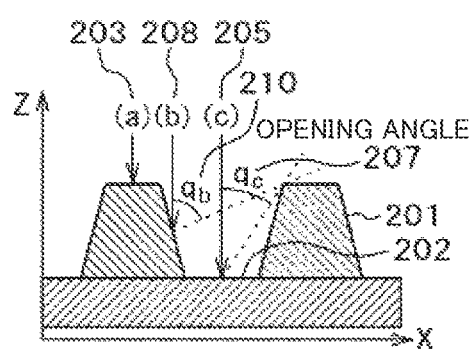
FIG. 2A is a cross-sectional view of a sample, in which a step pattern as an inspection object is formed, in the first embodiment of the present invention.

FIG. 2A is a schematic diagram of emission zenith angle distribution of secondary electrons generated upon irradiation of an electron beam to a sample having a pattern with a step formed with a projection and a groove such as a line, a hole and the like (hereinafter, it is written as a step pattern). In this example, a groove 202 of the step pattern of the sample is formed with a material having a secondary electron emission rate higher than that of a projection 201 of the step pattern. Further, an opening angle $q_c$ 207 of the groove of the step pattern is slightly larger than a discriminative boundary zenith angle $q_D$ 211.

Figure 2B:
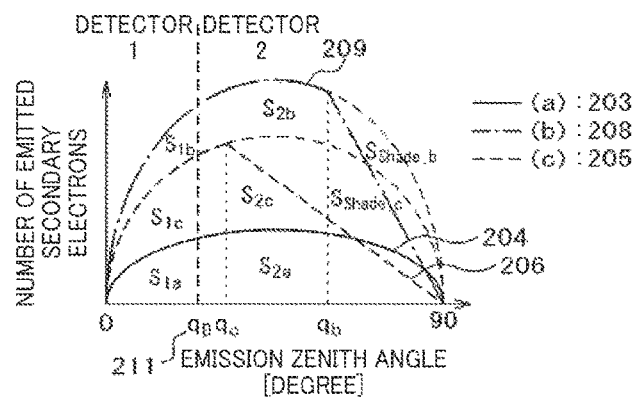
FIG. 2B is a graph showing the relationship between an emission zenith angle indicating emission zenith angle distribution of secondary electrons and the number of emitted secondary electrons upon irradiation of an electron beam to the sample where the step pattern as an inspection object is formed, in the first embodiment of the present invention.

As shown in FIG. 2B, emission zenith angle distribution 204 of secondary electrons generated upon irradiation of an electron beam to a flat part 203 at the center of the projection of the step pattern has a symmetrical shape at about 45°. On the other hand, in emission zenith angle distribution 206 of secondary electrons generated upon irradiation of an electron beam to a flat part 205 at the center of the groove of the step pattern, the number of electrons increases as a whole by the difference in material from the step pattern, and further, the number of secondary electrons at a zenith angle larger than the opening angle $q_c$ 207 from the irradiation point decreases.

The above phenomenon is caused by shielding of the secondary electrons with a side wall of a projection of an adjacent step pattern. Similarly, regarding secondary electrons 209 generated upon irradiation of an electron beam to a side wall 208, the number of electrons increases by edge effect. However, as in the case of irradiation to the flat part at the center of the groove of the step pattern, the zenith angle distribution shows a tendency that the number of secondary electrons at a zenith angle larger than the opening angle $q_b$ 210 from the irradiation point decreases.

The following expression presents this phenomenon. Assuming that the number of secondary electrons detected with the detector 1:119 upon irradiation of an electron beam to the flat part 203 at the center of the projection of the step pattern is $S_{1a}$; the number of secondary electrons detected with the detector 2:121 is $S_{2a}$; the number of secondary electrons detected with the detector 1:119 upon irradiation of an electron beam to the side wall 208 is $S_{1b}$; the number of secondary electrons detected with the detector 2:121 is $S_{2b}$; the number of secondary electrons shielded with the side wall is $S_{Shade\_b}$; the number of secondary electrons detected with the detector 1:119 upon irradiation of an electron beam to the flat part 205 at the center of the groove of the step pattern, $S_{1c}$; the number of secondary electrons detected with the detector 2:121 is $S_{2c}$; and the number of secondary electrons shielded with the wide wall is $S_{Shade\_c}$.

The number of secondary electrons $S_{1a}$ detected with the detector 1:119 is represented with the following expression (Expression 1). The number of secondary electrons $S_{2a}$ detected with the detector 2:121 is represented with the following expression (Expression 2). Further, the ratio between these numbers of secondary electrons is represented with the following expression (Expression 3). In the expressions, α is a coefficient to correct the difference of the secondary electron emission rate by the edge effect, and β is a coefficient to correct the difference of the secondary electron emission rate by difference in material. It is considered that when the material is homogeneous, the coefficient β is 1.

$$S_{1a} = \alpha S_{1b} = \beta S_{1c} \quad \text{(Expression 1)}$$

$$S_{2a} = \alpha(S_{2b} + S_{Shade\_b}) = \beta(S_{2c} + S_{Shade\_c}) \quad \text{(Expression 2)}$$

$$R = \frac{S_{2a}}{S_{1a}} = \frac{\alpha(S_{2b} + S_{shade\_b})}{\alpha S_{1b}} = \frac{\beta(S_{2c} + S_{shade\_c})}{\beta S_{1c}} \quad \text{(Expression 3)}$$

$$\rightarrow \frac{S_{2a}}{S_{1a}} > \frac{S_{2b}}{S_{1b}} > \frac{S_{2c}}{S_{1c}}$$

That is, the ratio R of the image signal intensity of the image signal from the detector 2:121 to the signal intensity of the image signal from the detector 1:119 has the characteristic that it is lower in the groove of the step pattern in comparison with that in the projection of the step pattern regardless of difference in material between the projection of the step pattern and the groove of the step pattern.

Figure 3:
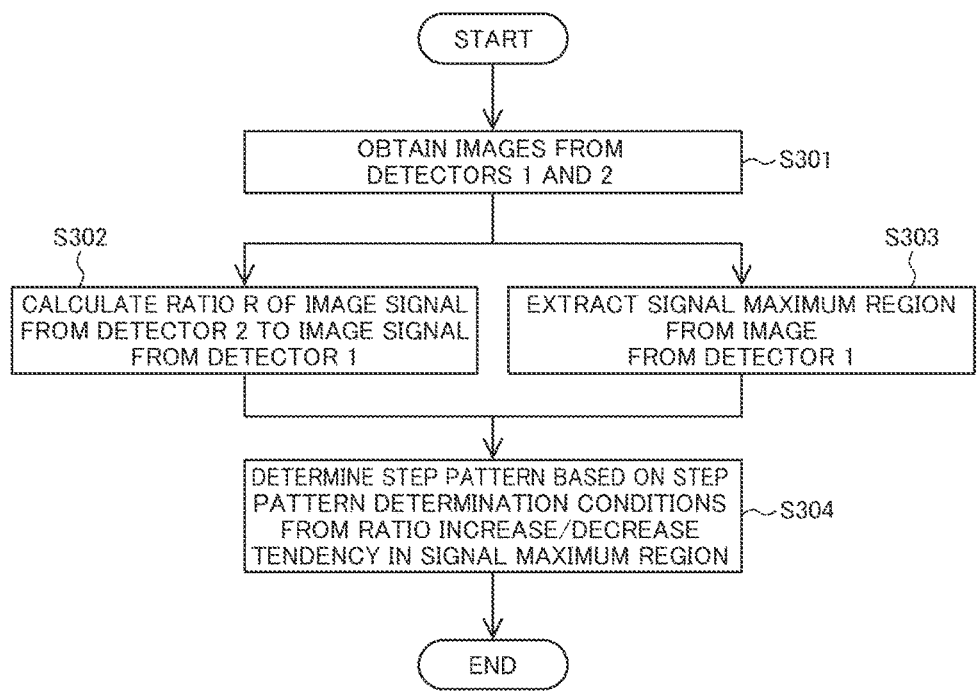
FIG. 3 is a flowchart showing the flow of step pattern determination according to the first embodiment of the present invention.

FIG. 3 is an example of a flowchart showing step pattern determination utilizing the characteristic of the secondary-electron emission zenith angle distribution shown in FIG. 2B.

First, images from the detector 1:119 and the detector 2:121 are obtained (S301).

Next, the ratio R of the image signal intensity of the image signal from the detector 2:121 to the image signal intensity of the image signal from the detector 1:119 is calculated by pixel. Then a ratio R image is generated (S302).

Figure 4:
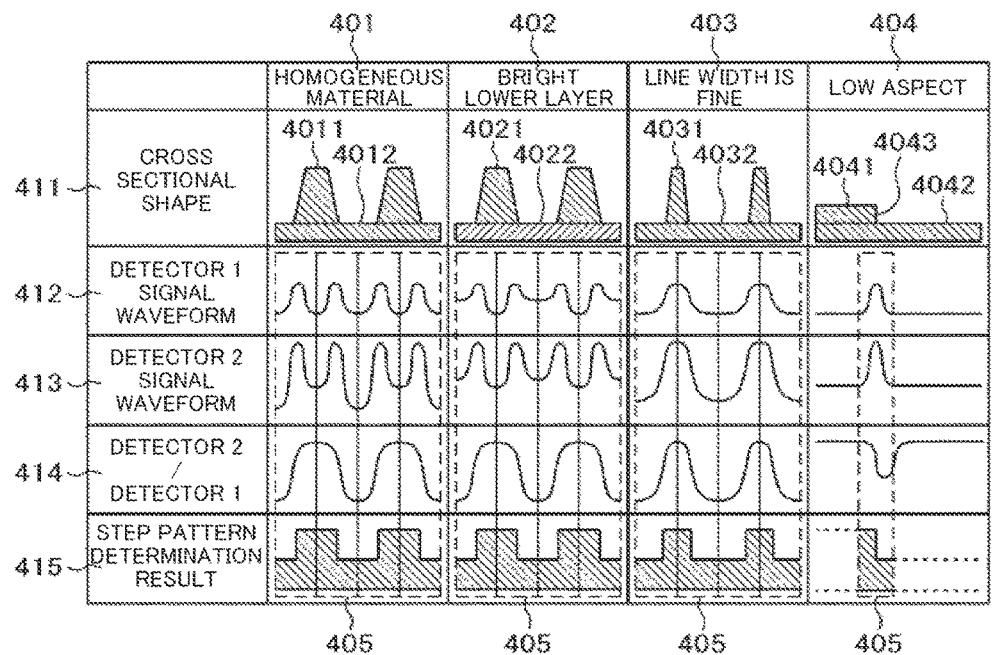
FIG. 4 is a table showing the relationship among a sample cross-sectional shape, signal waveforms of signals from the respective detectors, the ratio between the signals from the detectors, the cross-section determination result, a step pattern shape, and materials, in the first embodiment of the present invention.

FIG. 4 is a schematic diagram showing a cross-sectional shape 411 of a sample, a signal waveform (image signal) 412 from the detector 1:119, a signal waveform (image signal) 413 from the detector 2:121, and a waveform of a ratio R:414 of the signal waveform (image signal) 413 from the detector 2:121 to the signal waveform (image signal) 412 from the detector 1:119, and a step pattern determination result 415. As described in FIG. 2B, even when the material is homogeneous (a column 401 in FIG. 4), or even when the secondary electron emission rate of a lower-layer material is high and an image of the lower layer is bright (a column 402 in FIG. 4), the waveform in the column of ratio R:414 is smaller in grooves 4012 and 4022 of the step pattern in comparison with that in projections 4011 and 4021 of the step pattern.

Further, when the line width is fine (403 in FIG. 4), signal maximum regions at right and left edges of a projection 4031 of the step pattern are interfered with each other and become one region in the signal waveform 412 from the detector 1 and in the signal waveform 413 from the detector 2. The ratio R:414 is lower in a groove 4032 of the step pattern in comparison with that in a projection 4031 of the step pattern regardless of the number of signal maximum regions.

Further, when the aspect ratio is low (404 in FIG. 4), the ratio R:414 is lowered once on the groove 4042 side in the step pattern. Then, in accordance with increase in distance from a wall 4043 of the step pattern, the ratio R:414 gradually becomes closer to the ratio R in the projection 4041 of the step pattern. The change of the ratio R:414 is caused because the shielding effect becomes less in accordance with increase in distance from the wall 4043 of the step pattern.

At the next step, a signal maximum region 405 is extracted from the signal waveform 412 from the detector 1:119 (S303).

The secondary electron signal intensity increases in the side surface part by the edge effect. Accordingly, to detect an edge part, a signal maximum region is extracted. As a particular extraction method, with reference to an appropriate signal amount, in the signal waveform 412 from the detector 1:119, a region where the signal amount is greater than the reference is determined as the maximum region 405.

Finally, from the increase/decrease tendency of the ratio R:414 in the maximum region 405 of the extracted signal, the step pattern is determined based on the step pattern determination conditions (S304).

Figure 5:
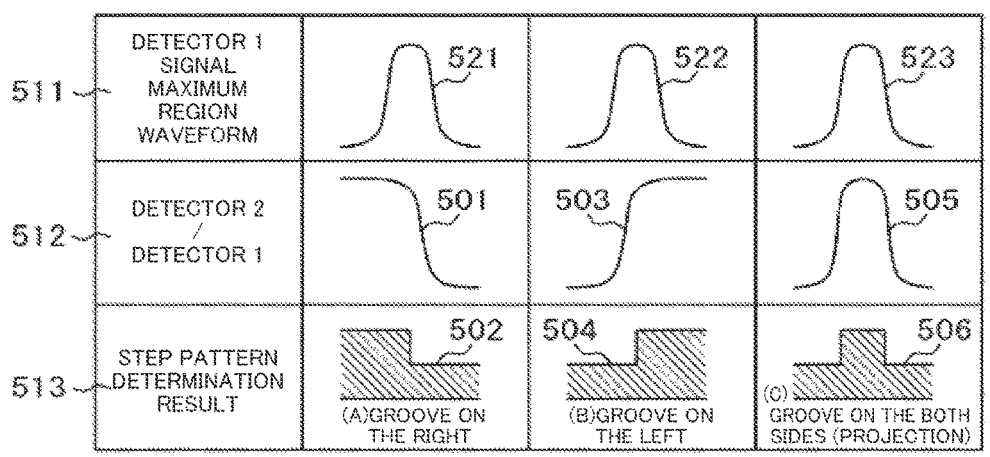
FIG. 5 is a table showing step pattern determination conditions in the first embodiment of the present invention.

FIG. 5 is a table showing the step pattern determination conditions. In a case where the signal maximum region waveform 511 in the signal from the detector 1 corresponds to a waveform 521, when a curve indicating the ratio R: 512 of the signal waveform (image signal) from the detector 2:121 to the signal waveform (image signal) from the detector 1:119 is downward-sloping to the right as in the case of a curve 501, it is determined as a step pattern determination result 513 that the right side of the step pattern is a groove 502.

Further, in a case where the signal maximum region waveform 511 in the signal from the detector 1 corresponds to a waveform 522, when a curve indicating the ratio R: 512 of the signal waveform (image signal) from the detector 2:121 to the signal waveform (image signal) from the detector 1:119 is downward-sloping to the left as in the case of a curve 503, it is determined as the step pattern determination result 513 that the left side of the step pattern is a groove 504.

Further, in a case where the signal maximum region waveform 511 in the signal from the detector 1 corresponds to a waveform 523, when a curve indicating the ratio R: 512 of the signal waveform (image signal) from the detector 2:121 to the signal waveform (image signal) from the detector 1:119 is downward-sloping to the both sides as in the case of a curve 505, it is determined as the step pattern determination result 513 that the step pattern have grooves 506 on the right and left sides, i.e., corresponds to a projection of a step pattern.

As shown in the step pattern determination results in FIG. 5, it is possible to qualitatively determine the step pattern regardless of material, dimensions, aspect ratio and the like of the sample.

Figure 6:
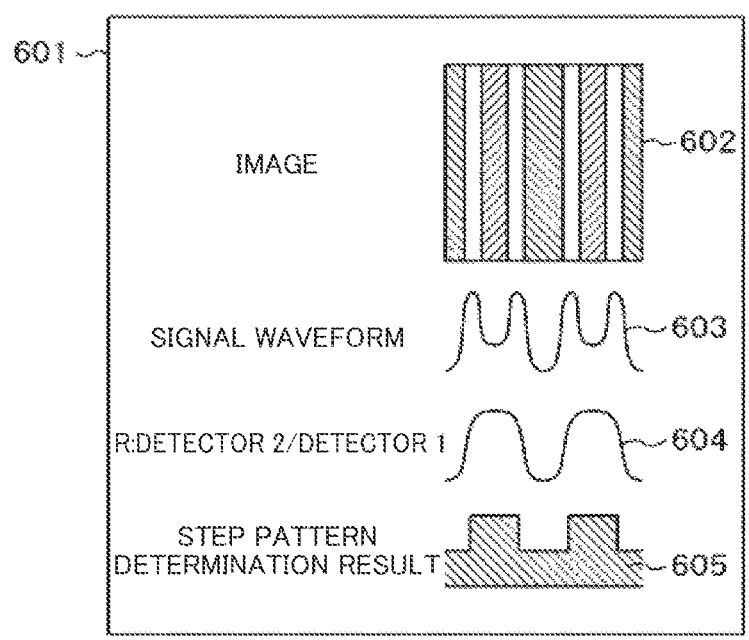
FIG. 6 is a front view of a screen to which the step pattern determination result is outputted in the first embodiment of the present invention.

FIG. 6 shows an example of a screen 601 to which the step pattern determination result is outputted.

In addition to a captured image 602 from the detector 1 and a signal waveform 603 as a part of the captured image, a waveform 604 of the ratio R and an obtained step pattern determination result 605 are displayed. Note that the captured image 602 may be an image from the detector 2, or may be a mixture of the images from the detectors 1 and 2.

Figure 7:
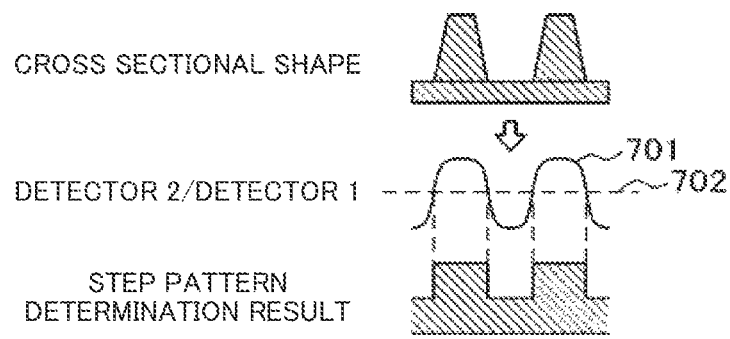
FIG. 7 shows the sample cross-sectional shape, signal ratio and waveform, and a step pattern determination result, with another step pattern determination condition, in the first embodiment of the present invention.

In the present embodiment, a signal maximum region is extracted from the signal waveform from the detector 1:119. Then the step pattern is determined based on the step pattern determination reference as shown in the table of FIG. 5. However, in the present embodiment, regarding an object having a sufficiently high aspect ratio in a groove of the step pattern such as a step pattern where the ratio R is always lower in the groove than in the projection, it may be configured such that, as shown in FIG. 7, a region where a ratio R 701 is higher than a previously-set reference value 702 is determined as a projection of the step pattern. The reference value 702 may be set as an intermediate value between maximum and minimum values.

The processing to determine a step pattern as an evaluation object has been described as above. The step pattern determination result is utilized for automatically determining a measurement position. Further, the step pattern determination result is also utilized for pattern alignment and extraction of a pattern similar to a template.

Second Embodiment

In the present embodiment, an example of template matching using the ratio R will be described. In the first embodiment, the processing to extract a pattern similar to a template using a step pattern determination result has been described. In the present embodiment, the step pattern determination is not performed.

The scanning electron microscope in the present embodiment has the same configuration as that described in the first embodiment. Accordingly, the explanation of the configuration will be omitted.

Figure 8:
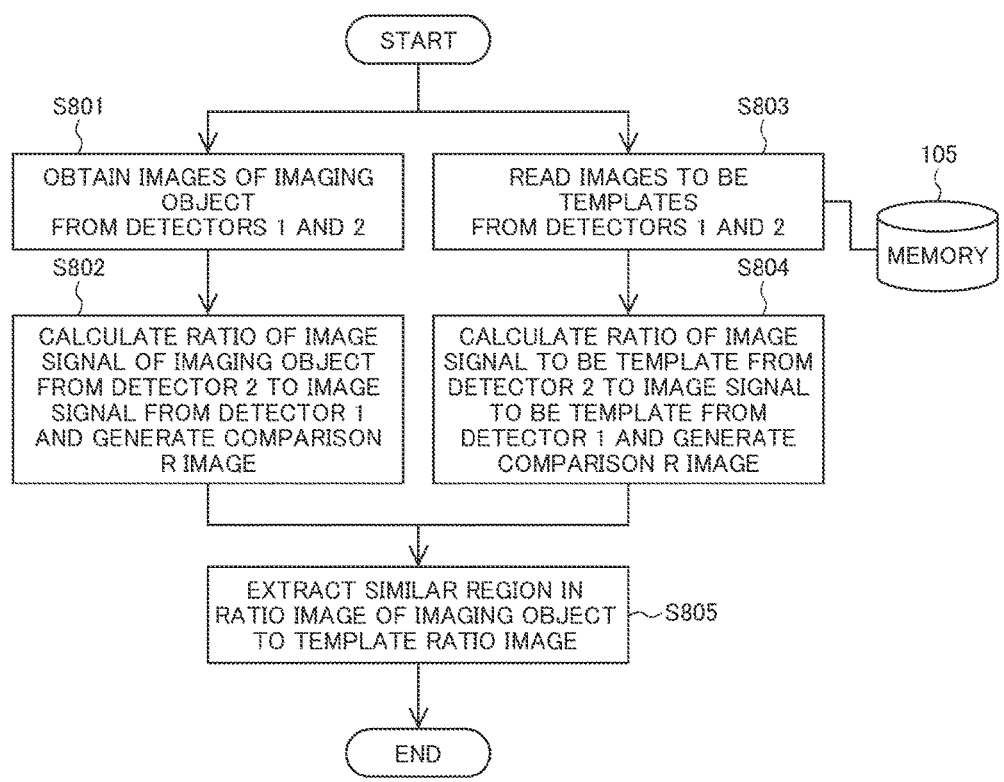
FIG. 8 is a flowchart showing the flow of template matching according to a second embodiment of the present invention.

FIG. 8 is an example of a flowchart showing the template matching with the scanning electron microscope shown in FIG. 1.

First, the images from the detector 1:119 and the detector 2:121 are obtained (S801).

Next, the ratio R of the image signal from the detector 2:121 to the image signal from the detector 1:119 is calculated by pixel, and the ratio R image is generated (S802).

Figure 9:
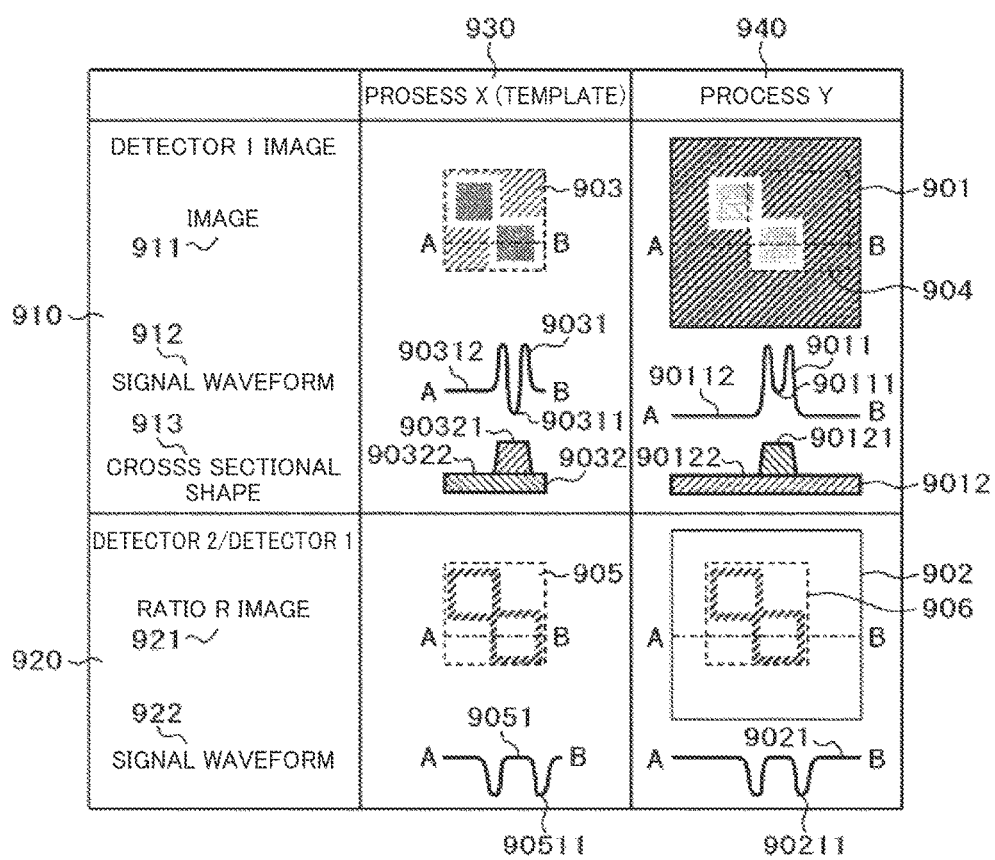
FIG. 9 is a table showing the relationship between a template and an image obtained at a process Y in the template matching according to the second embodiment of the present invention.

FIG. 9 shows an example of the obtained image 901 from the detector 1:119 and the calculated ratio R image 902, at a process Y: 940. FIG. 9 shows, at a process X (template) 930 and the process Y: 940, an image 911 and a signal waveform 912 as a part of the image 911, and a pattern cross-sectional shape 913, regarding the detector 1 image 910. Further, FIG. 9 shows the ratio R image and a signal waveform 922 as a part of the ratio R image, regarding an image 920 obtained based on the ratio R of signal intensity between the detector 1 and the detector 2.

Regarding the image 911 obtained from the detector 1 image 910, in an image signal waveform 9011 in an A-B cross section of the image 901 obtained at the process Y:940, a signal waveform 90112 corresponding to a groove 90122 of the step pattern shown in a cross-sectional shape 9012 is darker than a signal waveform 90111 corresponding to a projection 90121 of the step pattern, by difference in material between the projection of the step pattern and the groove of the step pattern.

Further, regarding a ratio R image 921 obtained by signal comparison 920 between signals from the detector 1 and the detector 2, in a signal waveform 9021 in an A-B cross section of the ratio R image 902 obtained at the process Y: 940, a minimum region 90211 appears on the groove side of the step pattern at a step boundary in the pattern. This phenomenon is caused by the shielding effect described in the first embodiment.

Next, template pattern images from the detector 1:119 and the detector 2:121 used for search in the obtained images are read. These images are previously obtained and stored in the memory 105 (S803).

FIG. 9 shows an example of a template pattern image 903 from the detector 1:119 at a process X: 930. The relationship regarding a step pattern 9032 is similar to that at the process Y: 940; however, the material of the step pattern 9032 is different from that at the process Y: 940. In an image signal waveform 9031 in an A-B cross section of the image 903, a signal waveform 90312 of a groove 90322 of the step pattern 9032 is brighter than a signal waveform 90311 of a projection 90321 of the step pattern 9032. In this example, there is a possibility that when the template matching using the image signals is performed, a wrong region 904 having a similar signal intensity relationship is extracted.

Next, the ratio R of the image signal intensity of the template pattern from the detector 2 to the image signal intensity of the template pattern from the detector 1 is calculated by pixel, and the ratio R image is generated (S804).

FIG. 9 shows the generated template-pattern ratio R image 905 and a signal waveform 9051 in an A-B cross section of the image at the process X: 930. In the signal waveform 9051, as in the case of the process Y: 940, a minimum region 90511 appears on the groove 90322 side of the step pattern 9032 at a step boundary in the pattern regardless of image signal.

Finally, in the image ratio R image 902, a similar region 906 similar to the template-pattern ratio R image 905 is extracted (S805). As a more particular extraction method, determination of a position where the correlation value is maximum, and general template matching, are applicable.

As shown in FIG. 9, since the difference in signal due to material is eliminated by using the ratio R image 921, the above-described method is appropriate to matching between processes using different materials.

Figure 10:
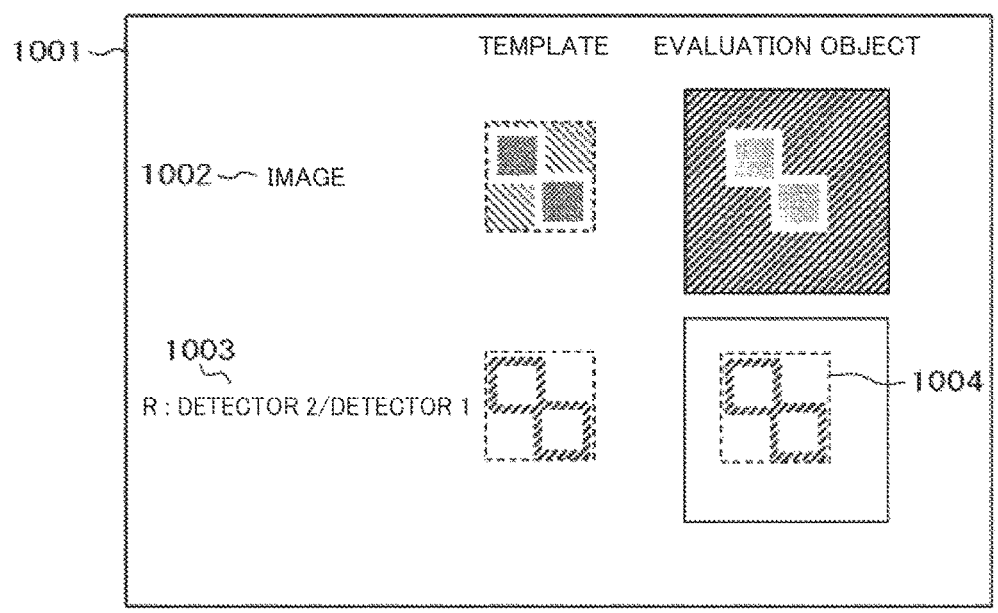
FIG. 10 is a front view of the screen to which the result of template matching according to the second embodiment of the present invention is outputted.

FIG. 10 shows an example of an output screen 1001 to which a template-matching result using the ratio R of the signal from the detector 2 to the signal from the detector 1 is outputted.

In addition to an image 1002, a ratio R image 1003 and a region 1004 selected by the matching are displayed.

According to the present embodiment, even when the material of an evaluation object (sample) and that of a template are different, it is possible to perform pattern matching with high reliability.

Third Embodiment

In the present embodiment, an example of evaluation of the depth of a groove of a step pattern, or evaluation of the height of a projection of the step pattern, using the ratio R of the signal from the detector 2 to the signal from the detector 1, will be described.

The scanning electron microscope in the present embodiment has the same configuration as that of scanning electron microscope 100 described in the first embodiment. Accordingly, the explanation of the configuration will be omitted.

Figure 11:
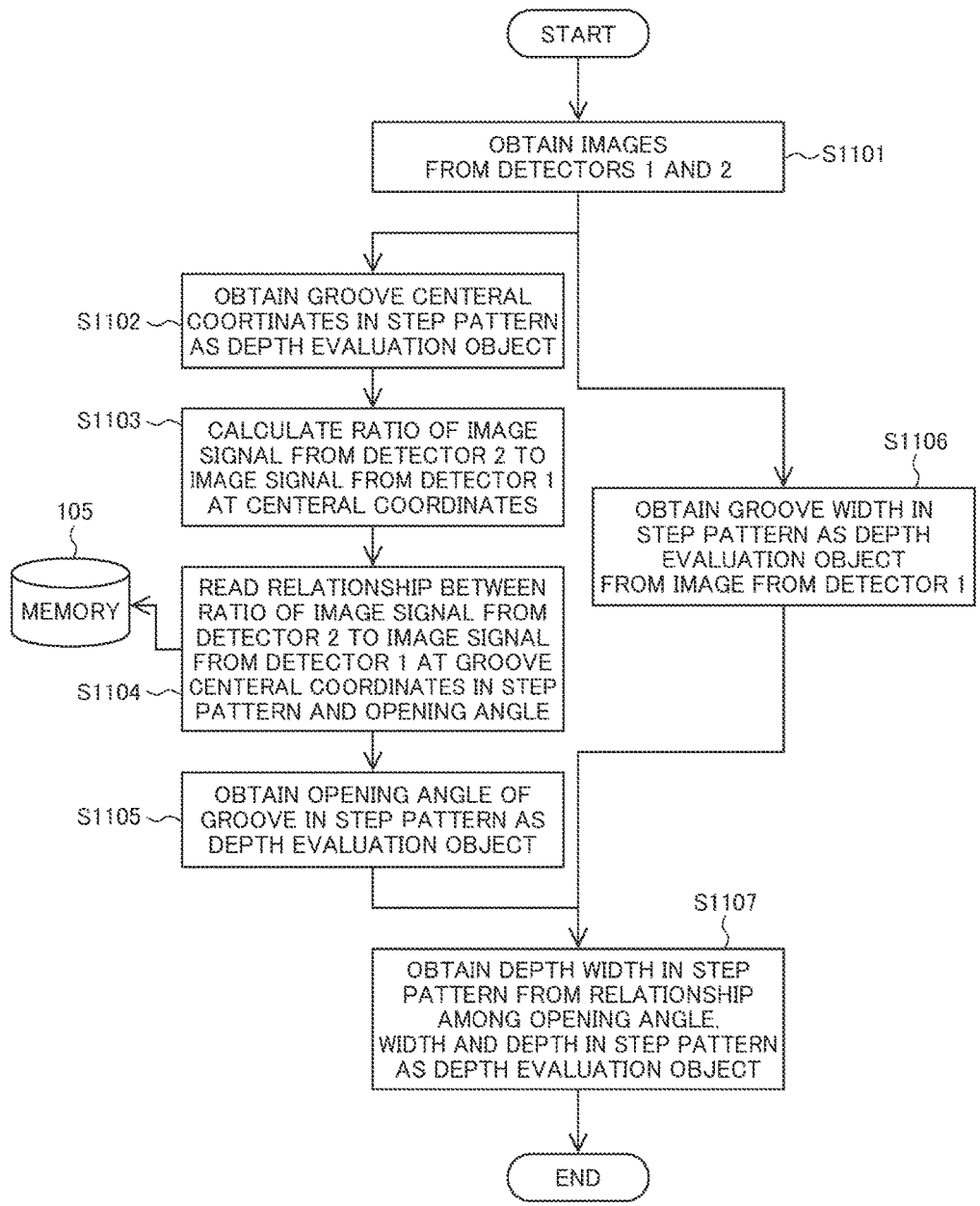
FIG. 11 is a flowchart showing the flow of groove depth evaluation in a step pattern according to a third embodiment of the present invention.

FIG. 11 is an example of a flowchart showing groove depth evaluation in a step pattern with the scanning electron microscope shown in FIG. 1.

First, images from the detector 1 and the detector 2 are obtained (S1101).

Next, in the respective obtained images, central coordinates of a groove of a step pattern as a depth evaluation object are obtained (S1102).

Next, a ratio $R_{x\_ev}$ of the signal from the detector 2 to the signal from the detector 1 at the central coordinates is calculated (S1103).

Figure 12A:
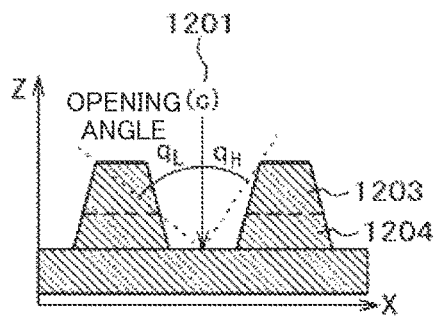
FIG. 12A is a cross-sectional view of the sample where the step pattern as an inspection object is formed in the third embodiment of the present invention.
Figure 12B:
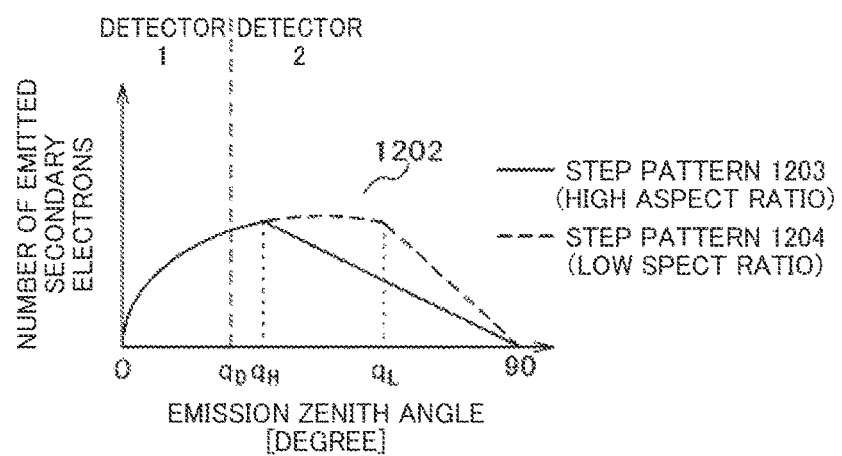
FIG. 12B is a graph showing the relationship between a secondary-electron emission zenith angle and the number of secondary electrons upon irradiation of the electron beam to a step pattern as an evaluation object, in the third embodiment of the present invention.

FIG. 12A shows an opening angle $q_H$ and an opening angle $q_L$ of respective patterns in cross sections of a high step pattern 1203 and a low step pattern 1204. FIG. 12B is a graph showing secondary-electron emission zenith angle distribution 1202 at central coordinates 1201 of the grooves of the step pattern 1203 and the step pattern 1204 with different opening angles.

The aspect ratio increases while the opening angle $q_x$ decreases in accordance with increase in depth of the groove of the step pattern. That is, in the case shown in FIG. 12A, in the step pattern 1203, the opening angle $q_x$ is $q_H$; and in the step pattern 1204, the opening angle $q_x$ is $q_L$. That is, $q_H < q_L$ holds. As the opening angle $q_x$ becomes smaller, the signal detected with the detector 2 decreases. That is, as shown in FIG. 13, the ratio $R_x$ of the detection signal from the detector 2:121 to the detection signal from the detector 1:119 at the central coordinates (1201 in FIG. 12A) becomes lower as the opening angle $q_x$ becomes smaller.

Figure 13:
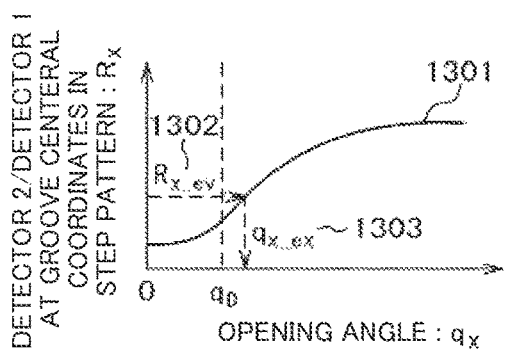
FIG. 13 illustrates an example of the relationship between a ratio of a signal from a detector 2 with respect to a signal from a detector 1 and an opening angle, in the third embodiment of the present invention.

Next, relationship 1301, as illustrated in the graph of FIG. 13, between the ratio $R_x$ of the signal intensity of the image signal from the detector 2 to the signal intensity of the image signal from the detector 1 in the groove of the step pattern and the opening angle $q_x$ is read from the memory 105 (S1104). The relationship 1301 is previously obtained and stored in the memory 105.

The acquisition of the relationship 1301 between the ratio $R_x$ and the opening angle $q_x$ is performed by evaluation of an actual sample, evaluation by simulation, or the like.

Next, based on the relationship 1301 between the ratio $R_x$ and the opening angle $q_x$, an opening angle $q_{x\_ev}$ 1303 of the groove of the step pattern corresponding to the ratio $R_{x\_ev}$ 1302 of the calculated depth evaluation object is obtained (S1105).

Next, to obtain the depth, a width CD of the groove of the step pattern is measured from the image from the detector 1 (S1106). As a particular method, the distance between signal maximum coordinates caused in the side walls of the step pattern is calculated. Otherwise, the depth is calculated by dimension measurement algorithm using a general scanning electron microscope image.

Finally, a depth H of the groove of the step pattern is calculated from the opening angle $q_{x\_ev}$ of the depth evaluation object and the width CD of the groove of the step pattern in accordance with the following expression (S1107).

$$H = \frac{CD}{2} \tan(90 - q_{x\_ev}) \qquad \text{(Expression 4)}$$

In the flowchart shown in FIG. 11, the depth of the groove of the step pattern is obtained; however, the height of the step pattern may be obtained.

Figure 14:
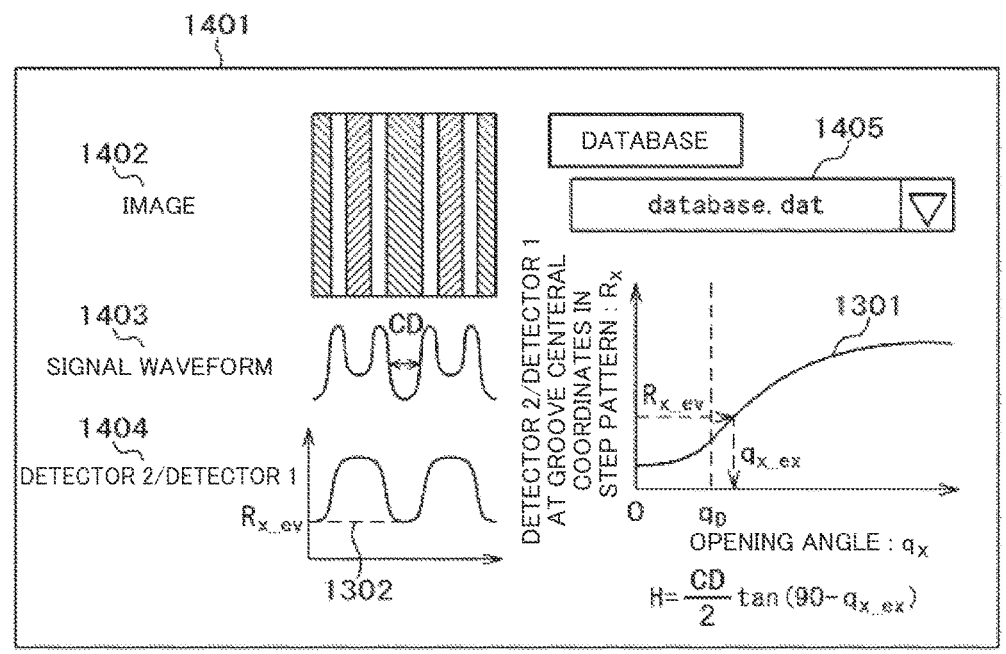
FIG. 14 illustrates an input/output screen in the groove depth evaluation in the step pattern, in the third embodiment of the present invention.

FIG. 14 shows an example of an input/output screen 1401 in the depth evaluation of the groove of the step pattern.

In addition to a captured image 1402 and a signal waveform 1403 as a part of the capture image, a ratio R waveform 1404, and the ratio $R_{x\_ev}$ 1302 of the signal from the detector 2 to the signal from the detector 1 at the central coordinates of the groove of the step pattern, are displayed. Further, a GUI 1401 to read a necessary database 1405 to obtain the opening angle $q_{x\_ev}$ is provided. The read database 1405 is displayed.

The relation 1301 between the ratio $R_x$ at the central coordinates of the groove of the step pattern and the opening angle $q_x$, used in the present embodiment, is stored in the form of graph as shown in FIG. 13, and may be stored in the form of an expression as below.

$$R = \frac{\text{Detector 2}}{\text{Detector 1}} = \frac{\int_{q_D}^{q_x} f(q)dq + \int_{q_x}^{90} g(q)dq}{\int_0^{q_D} f(q)dq} \quad \text{(Expression 5)}$$

Note that a function f(q) represents a secondary-electron emission zenith angle characteristic (secondary-electron emission zenith angle distribution) 204 without shielding upon irradiation of an electron beam to the center of the projection 201 of the step pattern shown in FIG. 2B. On the other hand, a function g (q) represents a secondary-electron emission zenith angle characteristic (secondary-electron emission zenith angle distribution) 206, with the secondary electrons being shielded, upon irradiation of an electron beam to the center of the groove 202 of the step pattern shown in FIG. 2B, and the opening angle $q_x$ corresponding to the opening angle $q_c$, showing a straight line connecting an intersection between the function f(q) and the opening angle $q_x$ and a zero point of the number of secondary electrons at an emission zenith angle of 90°.

Figure 15:
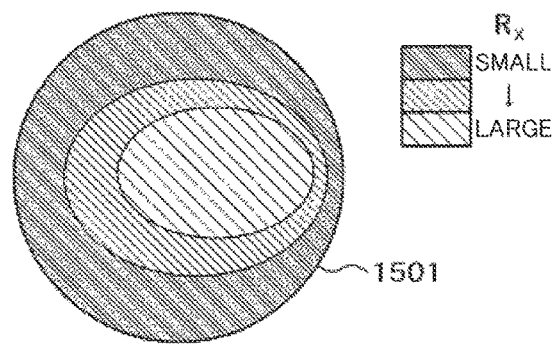
FIG. 15 is a plane view of a wafer showing an example of distribution areas of a ratio R of the signal from the detector 2 with respect to the signal from the detector 1 in the wafer plane, in the third embodiment of the present invention.
Figure 16:
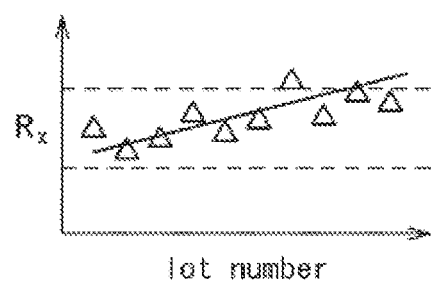
FIG. 16 is a graph showing an example of process time change of the ratio R of the signal from the detector 2 to the signal from the detector 1, in the third embodiment of the present invention.

In the present embodiment, the depth is obtained; however, it may be arranged such that when quantitative depth evaluation is not required in, e.g., monitoring of manufacturing process, it is outputted using the ratio $R_{x\_ev}$ at the central coordinates of the groove of the step pattern in place of the opening angle $q_{x\_ev}$. In this case, it is possible to monitor ratio-$R_x$ distribution 1501 in the wafer plane as shown in FIG. 15 or time change of the ratio $R_x$ as shown in FIG. 16. With this configuration, it is possible to know the in-plane distribution of the depth variation, time change of the depth and the like.

Figure 17:
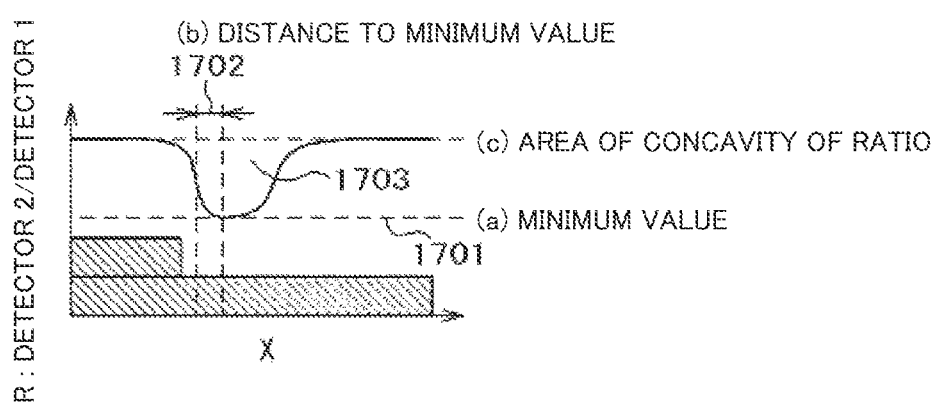

In the present embodiment, the ratio $R_x$ at the central coordinates of the groove of the step pattern is used. Further, a ratio R minimum value 1701, a distance 1702 between the ratio R minimum value and a wall, and an area 1703 of a concavity of the ratio R waveform, as shown in FIG. 17, also change in correspondence with the opening angle $q_x$. Accordingly, it is possible to obtain the opening angle $q_x$ by using these indices.

In the present embodiment, the depth is calculated by obtaining the opening angle $q_x$ of the evaluation object from the relationship between the ratio $R_x$ at the central coordinates of the groove of the step pattern and the opening angle $q_x$. Further, it may be configured such that the aspect ratio of the groove of the step pattern is used in place of the opening angle $q_x$. For example, in the graph of FIG. 13, a database where the opening angle $q_x$ on the horizontal axis is replaced with the aspect ratio is generated. In this case, in the right side of the Expression 4, the other item than the CD corresponds to the aspect ratio.

Fourth Embodiment

In the first embodiment to the third embodiment, the scanning electron microscope 100 shown in FIG. 1 is used; however, the present invention is not limited to this scanning electron microscope. Other examples of the configuration of the scanning electron microscope for discrimination of secondary-electron zenith angle will be described below.

Figure 18:
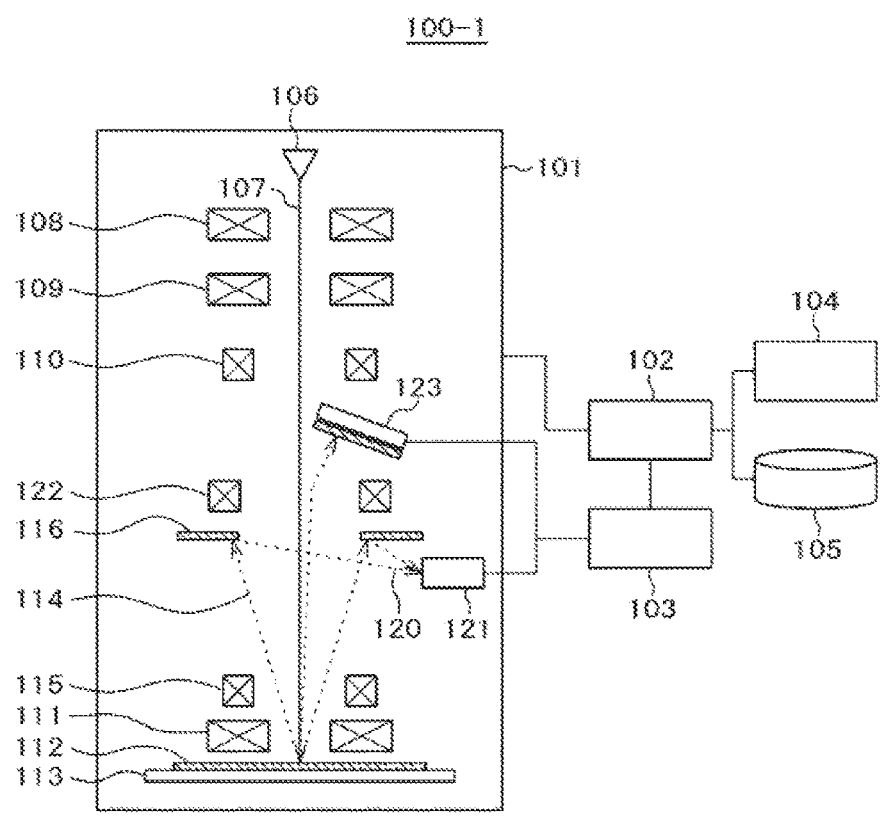
FIG. 18 is a block diagram showing a schematic configuration of a scanning electron microscope 100-1, having three stages of detectors, according to a fourth embodiment of the present invention.

In an example of a scanning electron microscope 100-1 shown in FIG. 18, the configuration of the scanning electron microscope 100 shown in FIG. 1 where the secondary electrons 114 having passed through the detection aperture 116 are reflected with the reflector 117 and tertiary electrons are detected with the detector 1:119, is replaced with a configuration having a secondary electron aligner 122 to control the track of the secondary electrons 114 having passed through the detection aperture 116 and a direct detector 123.

With this configuration, it is possible to control the track of the secondary electrons 114 with the secondary electron aligner 122 and detect the electrons with the direct detector 123.

Figure 19:
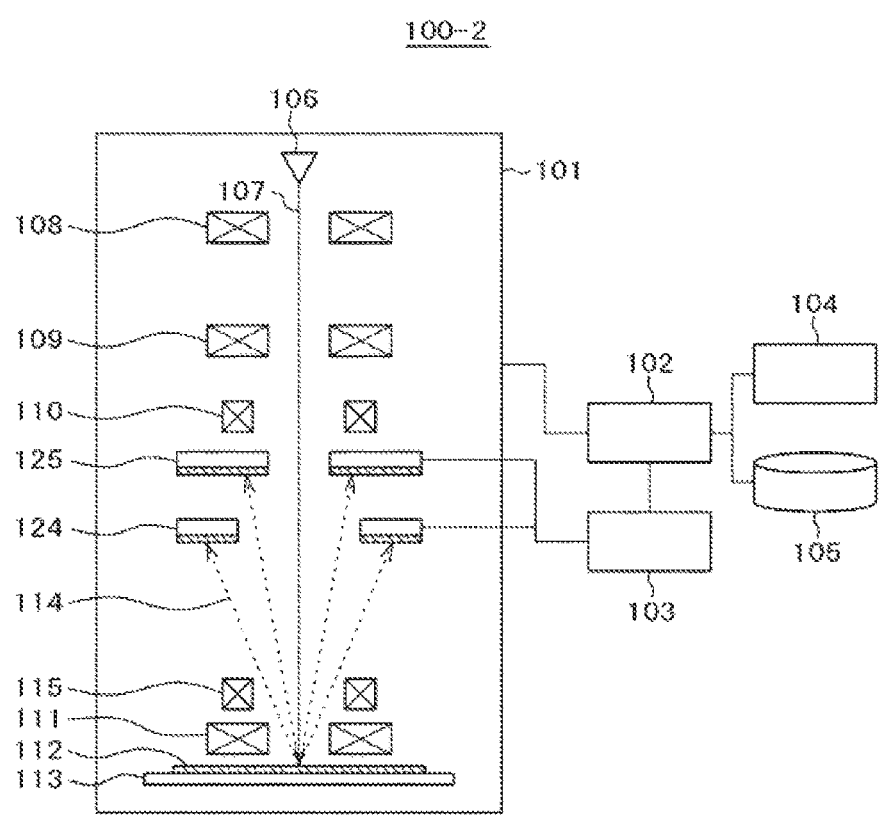
FIG. 19 is a block diagram showing a schematic configuration of a scanning electron microscope 100-2 according to the fourth embodiment of the present invention.

In an example of a scanning electron microscope 100-2 shown in FIG. 19, the configuration of the scanning electron microscope 100 shown in FIG. 1, having the detection aperture 116 to discriminate a detection angle for detecting the secondary electrons 114, the reflector 117 to detect the secondary electrons 114 having passed through the detection aperture 116, the detector 1:119 to detect the tertiary electron 118 generated by collision of the secondary electrons 114 against the reflector 117, and the detector 2:121 to detect the tertiary electrons 120 generated by collision of the secondary electron 114 against the detection aperture 116, is replaced with a configuration having a direct detector 124 and a direct detector 125.

With this configuration, among the secondary electrons 114 having passed through the secondary electron aligner 115, a secondary electron at a large emission zenith angle is detected with the direct detector 124, while a secondary electron at an emission zenith angle smaller than that detected with the direct detector 124 is detected with the direct detector 125.

In an example of a scanning electron microscope 100-3 shown in FIG. 20, the configuration of the scanning electron microscope 100 shown in FIG. 1, having the detection aperture 116 to discriminate a detection angle for detecting the secondary electrons 114, the reflector 117 to detect the secondary electrons 114 having passed through the detection aperture 116, the detector 1:119 to detect the tertiary electrons 118 generated by collision of the secondary electrons 114 against the reflector 117, and the detector 2:121 to detect the tertiary electrons 120 generated by collision of the secondary electrons 114 against the detection aperture 116, is replaced with a configuration having the direct detector 124, the secondary electron aligner 122, and the direct detector 123.

With this configuration, among the secondary electrons 114 having passed through the secondary electron aligner 115, a secondary electron at a large emission zenith angle is detected with the direct detector 124, the track of the secondary electron 114 having passed through the direct detector 124 is controlled with the secondary electron aligner 122, and the secondary electron 114, the track of which has been controlled with the secondary electron aligner 122, is detected with the direct detector 123.

In an example of a scanning electron microscope 100-4 shown in FIG. 21, the configuration of the scanning electron microscope 100 shown in FIG. 1, having the detection aperture 116, the reflector 117 to detect the secondary electrons 114 having passed through the detection aperture 116, the detector 1:119 to detect the tertiary electrons 118 generated by collision of the secondary electrons 114 against the reflector 117, and the detector 2:121 to detect the tertiary electrons 120 generated by collision of the secondary electrons 114 against the detection aperture 116, is replaced with a configuration having the direct detector 124 having a double-doughnut structure and a direct detector 129 inside the direct detector 124.

With this configuration, among the secondary electrons 114 having passed through the secondary electron aligner 115, a secondary electron at a large emission zenith angle is detected with the direct detector 124, and a secondary electron at a small emission zenith angle is detected with the direct detector 129.

Figure 22:
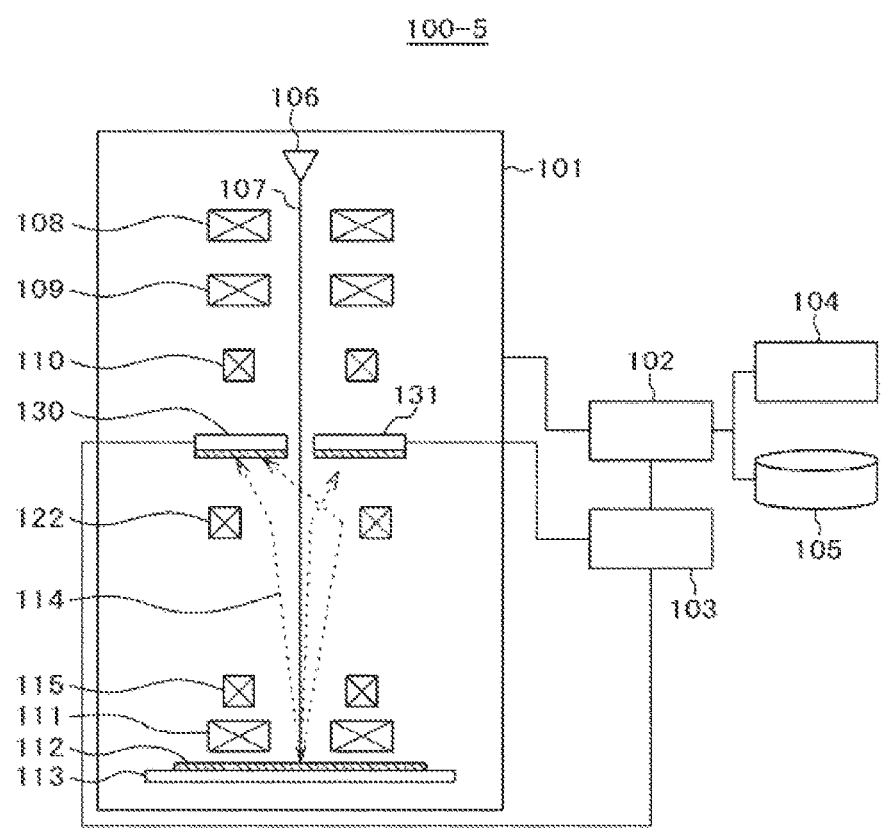
FIG. 22 is a block diagram showing a schematic configuration of a scanning electron microscope 100-5 according to the fourth embodiment of the present invention.

In an example of a scanning electron microscope 100-5 shown in FIG. 22, the configuration of the scanning electron microscope 100 shown in FIG. 1, having the detection aperture 116, the reflector 117 to detect the secondary electrons 114 having passed through the detection aperture 116, the detector 1:119 to detect the tertiary electrons 118 generated by collision of the secondary electrons 114 against the reflector 117, and the detector 2:121 to detect the tertiary electrons 120 generated by collision of the secondary electrons 114 against the detection aperture 116, is replaced with a configuration having the secondary electron aligner 122, and axial-symmetrically provided direct detector 130 and direct detector 131.

With this configuration, by further passing the secondary electrons 114, having passed through the secondary electron aligner 115, through the secondary electron aligner 122, a secondary electron at a small emission zenith angle is deflected in the direction of the direct detector 131, and a secondary electron at a large emission zenith angle is deflected in the direction of the direct detector 130, such that the secondary electrons are detected with the respective detectors.

Fifth Embodiment

In the present embodiment, another example of the scanning electron microscope for determination of imaging object step pattern will be described. In the first embodiment, the scanning electron microscope has two detectors. In the present embodiment, the scanning electron microscope has three detectors.

Figure 23:
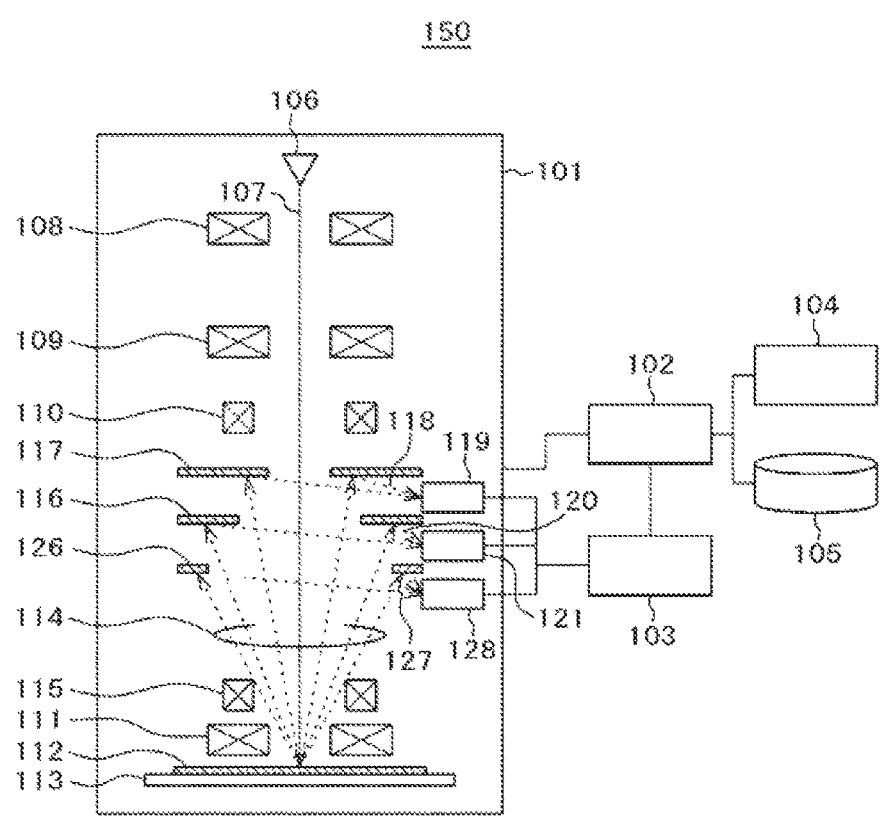
FIG. 23 is a block diagram showing a schematic configuration of the scanning electron microscope, having three stages of detectors, according to a fifth embodiment of the present invention.

FIG. 23 shows an example of the configuration of a scanning electron microscope 150 according to the present embodiment.

The basic configuration is the same as that of the scanning electron microscope 100 described using FIG. 1 in the first embodiment. However, in the present embodiment, the detection aperture has a two-stage structure. A detection aperture 2:126 and a detector 3:128 are added with respect to the detection aperture 1:116 on the sample 112 side. With this configuration, tertiary electrons 127, generated by collision of the secondary electrons 114 having passed through the secondary electron aligner 115 against the detection aperture 2:126, are detected with the detection aperture 3:128.

Figure 24:
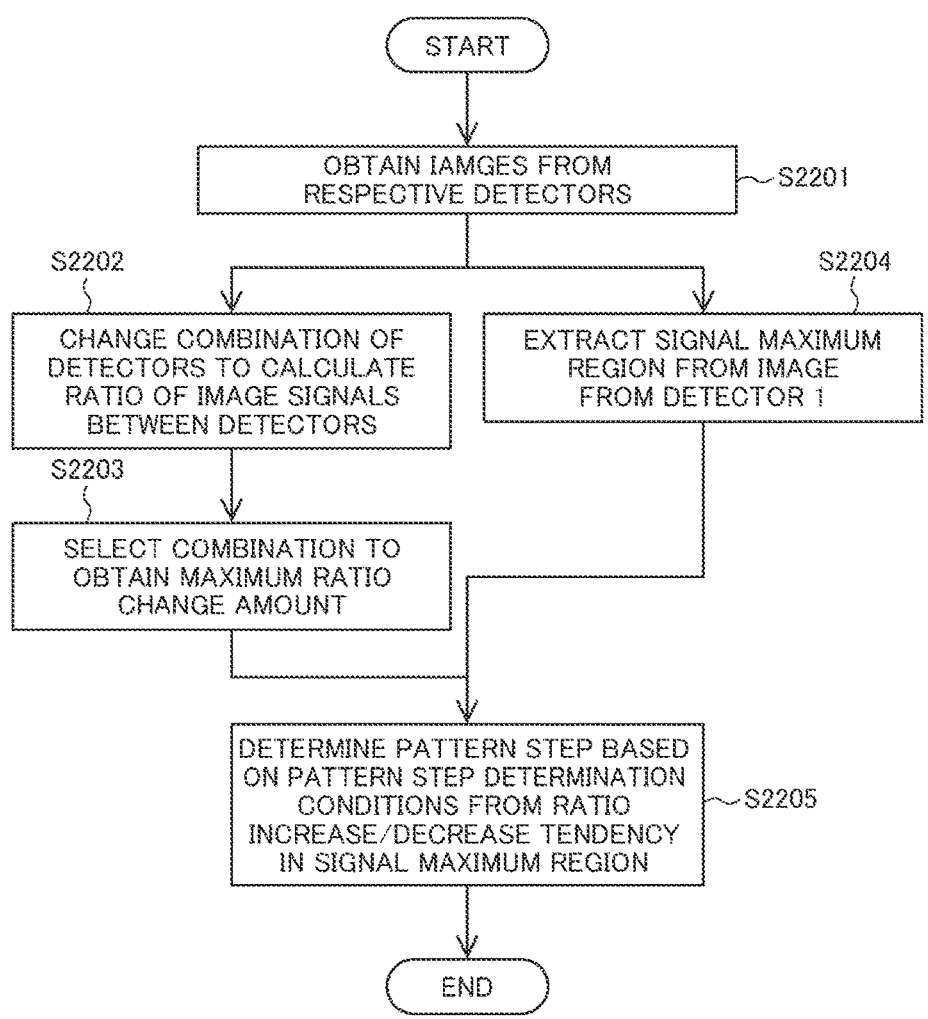
FIG. 24 is a flowchart showing the flow of step pattern determination using the scanning electron microscope, having three stages of detectors, according to the fifth embodiment of the present invention.

FIG. 24 is an example of a flowchart showing the step pattern determination with the scanning electron microscope 150 shown in FIG. 23.

First, images detected with the respective detectors are obtained (S2201).

Next, the combination of the detectors is changed to calculate the ratio between the image signals from the detectors (S2202).

Next, a combination of the detectors to obtain a maximum ratio change amount is selected as an optimum combination (S2203).

For example, in a step pattern 1203 with a high aspect ratio shown in FIG. 12A, when a ratio of the sum of the signals from the detector 2:121 and the detection aperture 3:128 to the signal from the detector 1:119 is selected, the difference between the ratio R in the projection of the step pattern and the ratio R in the groove of the step pattern is large. Further, in a step pattern 1204 with a low aspect ratio, when the ratio of the signal from the detection aperture 3:128 to the sum of the signals from the detector 1:119 and the detector 2:121 is selected, the difference between the ratio R in the projection of the step pattern and the ratio R in the groove of the step pattern is large.

The subsequent processing, i.e., the step to extract a signal maximum region from the image from the detector 1 (S2204) and the step to determine the step pattern based on the step pattern determination conditions from the ratio increase/decrease tendency in the signal maximum region (S2205) are the same as steps S303 and S304 in the flowchart of the step pattern determination in FIG. 3. Thus, the explanation of the subsequent processing will be omitted.

In the present embodiment, it may be configured such that, when a pattern with a high aspect ratio and a pattern with a low aspect ratio are mixed, the above-described two types of ratios are calculated, and the results of step extraction from these ratios are overlaid.

According to the present embodiment, even in a step pattern with a low aspect ratio, it is possible to more infallibly detect a step pattern.

Sixth Embodiment

In the present embodiment, in place of the ratio R of the signal from the detector 2:121 to the signal from the detector 1:119, used in from the first embodiment to the fifth embodiment, an example of use of another index value will be described.

In Patent Literature 1, step pattern determination is performed using a difference D between the signal from the detector 1 and the signal from the detector 2. However, as shown in the following expression (Expression 6), when a simple difference is used, there is a possibility that the relationship between the difference in the groove of the step pattern and the difference in the projection of the step pattern is reversed in accordance with difference β of secondary electron emission rate due to difference in material.

$$D = S_{2a} - S_{1a} = \alpha(S_{2b} + S_{shade\_b} - S_{1b}) \quad \text{(Expression 6)}$$
$$= \beta(S_{2c} + S_{shade\_c} - S_{1c})$$
$$\rightarrow S_{2a} - S_{1a} > \alpha(S_{2b} - S_{1b}) > \beta(S_{2c} - S_{1c})$$
$$\rightarrow S_{2a} - S_{1a} \gtreqless S_{2b} - S_{1b} \gtreqless S_{2c} - S_{1c}$$

In the present embodiment, with a flat film as an object, a coefficient γ to correct the difference between the detection signals from the respective detectors is obtained in advance. As represented with the following expression (Expression 7), the signals from the respective detectors are corrected with the correction coefficient γ, and then a difference $D_c$ is obtained. It is possible by using this difference $D_c$, to always obtain a result that the difference in the groove of the step pattern ($S_{2c}$-γ$S_{1c}$) is negative regardless of difference in material. It is possible to infallibly perform the step pattern determination.

$$\begin{cases} S_{2a} = \gamma S_{1a} \\ S_{2b} + S_{shade\_b} = \gamma S_{1b} \\ S_{2c} + S_{shade\_c} = \gamma S_{1c} \end{cases} \rightarrow D_c \begin{cases} S_{2a} - \gamma S_{1a} = 0 \\ S_{2b} - \gamma S_{1b} = -S_{shade\_b} < 0 \\ S_{2c} - \gamma S_{1c} = -S_{shade\_c} < 0 \end{cases} \quad \text{(Expression 7)}$$

It may be configured such that the ratio R of the signal from the detector 2:121 to the signal from the detector 1:119, described in from the first embodiment to the fifth embodiment, is replaced with the difference $D_c$ represented with the (Expression 7) for step pattern determination.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. A scanning electron microscope comprising:
a beam source that irradiates a primary electron beam;
a detection unit that detects secondary electrons generated from a measurement object by irradiation of the primary electron beam to the measurement object; and
a processing unit that processes a signal detected with the detection unit,
wherein the detection unit has:
a first detection unit that detects a secondary electron at an angle between an optical axis direction of the primary electron beam irradiated to the measurement object and an emission direction of the secondary electron from the measurement object equal to or less than a predetermined value; and
a second detection unit that detects the secondary electron at an angle between the optical axis direction of the primary electron beam irradiated to the measurement object and the emission direction of the secondary electron from the measurement object greater than the predetermined value, and
wherein the processing unit obtains a ratio between signals outputted from the first detection unit and the second detection unit, and obtains information on a step pattern formed on the measurement object by using information on the obtained ratio.

2. The scanning electron microscope according to claim 1, wherein the processing unit extracts a signal maximum region of a signal obtained by detecting the secondary electrons with the first detection unit, and determines the step pattern using the information on the ratio between the signal obtained by detecting the secondary electrons with the first detection unit and a signal obtained by detecting the secondary electrons with the second detection unit in the extracted signal maximum region.

3. The scanning electron microscope according to claim 2, wherein the processing unit determines the step pattern based on previously set determination conditions, from an increase/decrease tendency of the ratio between the signal obtained by detecting the secondary electrons with the first detection unit and the signal obtained by detecting the secondary electrons with the second detection unit in the extracted signal maximum region.

4. The scanning electron microscope according to claim 1, further comprising an output unit having a screen,
wherein an image obtained by detecting the secondary electrons generated from the measurement object with the detection unit as well as information on the step pattern formed in the measurement object obtained with the processing unit are displayed on the screen.

5. The scanning electron microscope according to claim 1, further comprising a memory unit that holds relationship between information on the ratio between a signal obtained by detecting the secondary electrons with the first detection unit and a signal obtained by detecting the secondary electrons with the second detection unit, and an opening angle of a groove of the step pattern,
wherein a depth of the groove of the step pattern is obtained, using the information on the ratio obtained with the processing unit, based on the relationship between the information on the ratio and the opening angle of the groove of the step pattern stored in the memory unit.

6. A scanning electron microscope comprising:
a beam source that irradiates a primary electron beam;
a detection unit that detects secondary electrons generated from a measurement object by irradiation of the primary electron beam to the measurement object; and
a processing unit that processes a signal detected with the detection unit,
wherein the detection unit has:
a first detection unit that detects secondary electrons generated from the measurement object; and
a second detection unit that detects tertiary electrons generated by collisions of the secondary electrons against a reflector, wherein the second detection unit is provided on the measurement object side with respect to the beam source; and
wherein the processing unit obtains a ratio between signals outputted from the first detection unit and the second detection unit, and obtains information on a step pattern formed in the measurement object by using information on the obtained ratio.

7. The scanning electron microscope according to claim 6, wherein the processing unit obtains central coordinates of a groove of the step pattern formed in the measurement object from the signals outputted from the first detection unit and the second detection unit, and obtains a ratio between the signals outputted from the first detection unit and the second detection unit at the obtained central coordinates.

8. The scanning electron microscope according to claim 7, further comprising a memory unit that holds relation between information on the ratio between a signal obtained by detecting the secondary electrons with the first detection unit and a signal obtained by detecting the secondary electrons with the second detection unit and an opening angle of the groove of the step pattern,
wherein the processing unit obtains the opening angle of the step pattern formed in the measurement object from the relationship between the information on the ratio and the opening angle of the groove of the step pattern, stored in the memory unit, using the information on the ratio between the signals outputted from the first detection unit and the second detection unit at the obtained central coordinates.

9. The scanning electron microscope according to claim 8, wherein the processing unit obtains a width of the groove of the step pattern formed in the measurement object from the signal outputted from the first detection unit, and obtains information on the step pattern formed in the measurement object by using the obtained information on width of the groove of the step pattern and the obtained information on the opening angle of the step pattern formed in the measurement object.

10. The scanning electron microscope according to claim 6, further comprising an output unit having a screen,
wherein an image obtained by detecting the secondary electrons generated from the measurement object with the detection unit as well as information on the step pattern formed in the measurement object obtained with the processing unit are displayed on the screen.

* * * * *